United States Patent
Cebi et al.

(10) Patent No.: US 9,590,614 B2
(45) Date of Patent: Mar. 7, 2017

(54) NON-LINEARITY COMPENSATION IN RADIO FREQUENCY SWITCHES AND DEVICES

(71) Applicant: SKYWORKS SOLUTIONS, INC., Woburn, MA (US)

(72) Inventors: Haki Cebi, Allston, MA (US); Fikret Altunkilic, North Andover, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/019,233

(22) Filed: Feb. 9, 2016

(65) Prior Publication Data

US 2016/0156346 A1 Jun. 2, 2016

Related U.S. Application Data

(62) Division of application No. 14/708,540, filed on May 11, 2015, now Pat. No. 9,294,083, which is a division
(Continued)

(51) Int. Cl.
*H03K 17/16* (2006.01)
*H03K 17/30* (2006.01)
(Continued)

(52) U.S. Cl.
CPC ........... *H03K 17/162* (2013.01); *H01L 21/77* (2013.01); *H01L 21/823475* (2013.01); *H01L 27/0629* (2013.01); *H01L 28/75* (2013.01); *H03K 17/6871* (2013.01); *H03K 17/693* (2013.01); *H04B 1/44* (2013.01); *H01L 27/1203* (2013.01)

(58) Field of Classification Search
USPC .................................................. 327/379, 310
See application file for complete search history.

(56) References Cited

U.S. PATENT DOCUMENTS 2,980,902 A * 4/1961 Tasker .................. G01S 13/913
342/34
4,255,756 A * 3/1981 Shimotori ............... G05F 3/205
257/299
(Continued)

FOREIGN PATENT DOCUMENTS

JP 2005-515657 A 5/2005
JP 2008017416 A 1/2008
(Continued)

OTHER PUBLICATIONS

International Search Report and Written Opinion for PCT/US2013/049500 issued on Dec. 23, 2013.
(Continued)

*Primary Examiner* — Adam Houston
(74) *Attorney, Agent, or Firm* — Chang & Hale LLP

(57) ABSTRACT

Radio frequency (RF) switches and devices provide improved switching performance. An RF switch includes at least one field-effect transistor (FET) disposed between a first node and a second node, each of the at least one FET having a respective source, drain, gate, and body, and a compensation circuit connected to the respective drain of the at least one FET that compensates a non-linearity effect generated by the at least one FET.

20 Claims, 9 Drawing Sheets

Related U.S. Application Data of application No. 13/936,170, filed on Jul. 6, 2013, now Pat. No. 9,059,702.

(60) Provisional application No. 61/669,035, filed on Jul. 7, 2012.

(51) Int. Cl.
*H01L 21/77* (2006.01)
*H03K 17/693* (2006.01)
*H01L 21/8234* (2006.01)
*H01L 49/02* (2006.01)
*H03K 17/687* (2006.01)
*H01L 27/06* (2006.01)
*H04B 1/44* (2006.01)
*H01L 27/12* (2006.01)

(56) References Cited

U.S. PATENT DOCUMENTS

| | | | |
|---|---|---|---|
| 4,999,585 A * | 3/1991 | Burt | H03F 1/32 330/149 |
| 5,382,826 A | 1/1995 | Mojaradi et al. | |
| 5,644,266 A | 7/1997 | Chen et al. | |
| 5,748,016 A | 5/1998 | Kurosawa | |
| 5,753,955 A | 5/1998 | Fechner | |
| 5,969,564 A | 10/1999 | Komatsu et al. | |
| 6,281,737 B1 | 8/2001 | Kuang et al. | |
| 6,989,706 B2 | 1/2006 | Sekigawa et al. | |
| 7,095,266 B2 | 8/2006 | Miske | |
| 7,236,044 B2 | 6/2007 | Talwalkar et al. | |
| 7,385,436 B2 | 6/2008 | Itoh et al. | |
| 7,619,462 B2 | 11/2009 | Kelly et al. | |
| 7,659,765 B2 | 2/2010 | Ito | |
| 7,659,770 B2 | 2/2010 | Teraguchi et al. | |
| 7,683,433 B2 | 3/2010 | Kapoor et al. | |
| 7,848,712 B2 | 12/2010 | Fu et al. | |
| 7,885,614 B2 | 2/2011 | Jedeloo | |
| 7,890,063 B2 | 2/2011 | Ahn et al. | |
| 7,898,297 B2 | 3/2011 | Kapoor et al. | |
| 7,910,993 B2 | 3/2011 | Brindle et al. | |
| 7,928,794 B2 | 4/2011 | Balboni | |
| 8,054,143 B2 | 11/2011 | Takahashi | |
| 8,441,304 B2 | 5/2013 | Kinoshita et al. | |
| 8,461,903 B1 | 6/2013 | Granger-Jones | |
| 8,514,008 B2 | 8/2013 | Yan et al. | |
| 8,559,907 B2 * | 10/2013 | Burgener | H01Q 23/00 455/127.3 |
| 8,670,729 B2 * | 3/2014 | Behzad | H03F 3/45183 455/114.2 |
| 8,723,260 B1 | 5/2014 | Carroll et al. | |
| 8,779,840 B2 | 7/2014 | Sugiura et al. | |
| 8,908,751 B2 * | 12/2014 | Camuffo | H03F 1/0255 375/224 |
| 2005/0195037 A1 * | 9/2005 | Dupuis | H01L 23/645 330/279 |
| 2005/0239415 A1 | 10/2005 | Sagae et al. | |
| 2009/0181630 A1 | 7/2009 | Seshita et al. | |
| 2010/0060377 A1 | 3/2010 | Takahashi | |
| 2011/0012669 A1 | 1/2011 | Stuber et al. | |
| 2011/0025403 A1 | 2/2011 | Cassia | |
| 2011/0148501 A1 | 6/2011 | Granger-Jones et al. | |
| 2011/0169550 A1 | 7/2011 | Brindle et al. | |
| 2012/0146722 A1 | 6/2012 | Scott et al. | |
| 2013/0009725 A1 * | 1/2013 | Heaney | H01L 21/84 333/103 |
| 2014/0002171 A1 | 1/2014 | Nohra | |
| 2014/0009203 A1 * | 1/2014 | Cebi | H03K 17/162 327/379 |
| 2014/0009208 A1 * | 1/2014 | Smith | H04B 1/0458 327/391 |
| 2014/0009214 A1 * | 1/2014 | Altunkilic | H03K 17/161 327/427 |

FOREIGN PATENT DOCUMENTS

| | | |
|---|---|---|
| JP | 2008270964 A | 11/2008 |
| WO | 2011045442 A2 | 4/2011 |

OTHER PUBLICATIONS

Search Report for European Appl. No. 13817490.9 dated Feb. 3, 2016.

* cited by examiner

NON-LINEARITY COMPENSATION IN RADIO FREQUENCY SWITCHES AND DEVICES

RELATED APPLICATION

This application is a divisional of U.S. patent application Ser. No. 14/708,540, filed on May 11, 2015, titled "Semiconductor Devices and Methods Providing Non-Linear Compensation of Field-Effect Transistors," which is a divisional of U.S. patent application Ser. No. 13/936,170, filed on Jul. 6, 2013, titled "Switch Linearization by Non-Linear Compensation of a Field-Effect Transistor," which claims priority to U.S. Provisional Application No. 61/669,035, filed on Jul. 7, 2012, titled "Switch Linearization by Non-Linear Compensation of a Field-Effect Transistor," the disclosures of which are hereby incorporated by reference in their entirety.

BACKGROUND

Field

The present disclosure generally relates to the field of electronics, and more particularly, to radio-frequency switches.

Description of Related Art

Radio-frequency (RF) switches, such as transistor switches, can be used to switch signals between one or more poles and one or more throws. Transistor switches, or portions thereof, can be controlled through transistor biasing and/or coupling. Design and use of bias and/or coupling circuits in connection with RF switches can affect switching performance.

SUMMARY

According to some implementations, the present disclosure relates to a radio-frequency (RF) switch that includes at least one field-effect transistor (FET) disposed between first and second nodes, with each of the at least one FET having a respective source and drain. The switch further includes a compensation circuit connected to the respective source or the respective drain of each of the at least one FET. The compensation circuit is configured to compensate a non-linearity effect generated by the at least one FET.

In some embodiments, the FET can be a silicon-on-insulator (SOI) FET. In some embodiments, the compensation circuit can include a non-linear capacitor. The non-linear capacitor can include a metal-oxide-semiconductor (MOS) capacitor. The MOS capacitor can be configured to generate one or more harmonics to substantially cancel the non-linearity effect generated by the FET. The MOS capacitor can include an FET structure. The one or more harmonics generated by the MOS capacitor can be controlled at least in part by a body bias signal provided to the FET structure of the MOS capacitor.

In some embodiments, the non-linear capacitor can be connected to the source of the FET.

In some embodiments, the switch can further include a gate bias circuit connected to and configured to provide a bias signal to a gate of the FET.

In some embodiments, the switch can further include a body bias circuit connected to and configured to provide a bias signal to a body of the FET.

In some embodiments, the first node can be configured to receive an RF signal having a power value and the second node is configured to output the RF signal when the FET is in an ON state. The at least one FET can include N FETs connected in series, with the quantity N being selected to allow the switch circuit to handle the power of the RF signal.

In some implementations, the present disclosure relates to a method for operating a radio-frequency (RF) switch. The method includes controlling at least one field-effect transistor (FET) disposed between first and second nodes so that each of the at least one FET is in an ON state or an OFF state. The method further includes compensating a non-linear effect of the at least one FET by applying another non-linear signal to a respective source or a respective drain of each of the at least one FET.

In accordance with a number of implementations, the present disclosure relates to a semiconductor die that includes a semiconductor substrate and at least one field-effect transistor (FET) formed on the semiconductor substrate. The die further includes a compensation circuit connected to a respective source or a respective drain of each of the at least one FET. The compensation circuit is configured to compensate a non-linearity effect generated by the at least one FET.

In some embodiments, the die can further include an insulator layer disposed between the FET and the semiconductor substrate. The die can be a silicon-on-insulator (SOI) die.

In a number of implementations, the present disclosure relates to a method for fabricating a semiconductor die. The method includes providing a semiconductor substrate, and forming at least one field-effect transistor (FET) on the semiconductor substrate, with each of the at least one FET having a respective source and a respective drain. The method further includes forming a compensation circuit on the semiconductor substrate. The method further includes connecting the compensation circuit to the respective source or the respective drain of each of the at least one FET to thereby allow the compensation circuit to compensate a non-linearity effect generated by the at least one FET.

In some embodiments, the method can further include forming an insulator layer between the FET and the semiconductor substrate.

According to some implementations, the present disclosure relates to a radio-frequency (RF) switch module that includes a packaging substrate configured to receive a plurality of components. The module further includes a semiconductor die mounted on the packaging substrate, with the die having at least one field-effect transistor (FET). The module further includes a compensation circuit connected to a respective source or a respective drain of each of the at least one FET. The compensation circuit is configured to compensate a non-linearity effect generated by the at least one FET.

In some embodiments, the semiconductor die can be a silicon-on-insulator (SOI) die. In some embodiments, compensation circuit can be part of the same semiconductor die as the at least one FET. In some embodiments, the compensation circuit can be part of a second die mounted on the packaging substrate. In some embodiments, the compensation circuit can be disposed at a location outside of the semiconductor die.

In some implementations, the present disclosure relates to a wireless device that includes a transceiver configured to process RF signals. The wireless device further includes an antenna in communication with the transceiver configured to facilitate transmission of an amplified RF signal. The wireless device further includes a power amplifier connected to the transceiver and configured to generate the amplified RF signal. The wireless device further includes a switch connected to the antenna and the power amplifier and configured to selectively route the amplified RF signal to the antenna. The switch includes at least one field-effect transistor (FET). The switch further includes a compensation circuit connected to a respective source or a respective drain of each of the at least one FET. The compensation circuit is configured to compensate a non-linearity effect generated by the at least one FET.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

DETAILED DESCRIPTION

The headings provided herein, if any, are for convenience only and do not necessarily affect the scope or meaning of the claimed invention.

Example Components of a Switching Device

Figure 1:
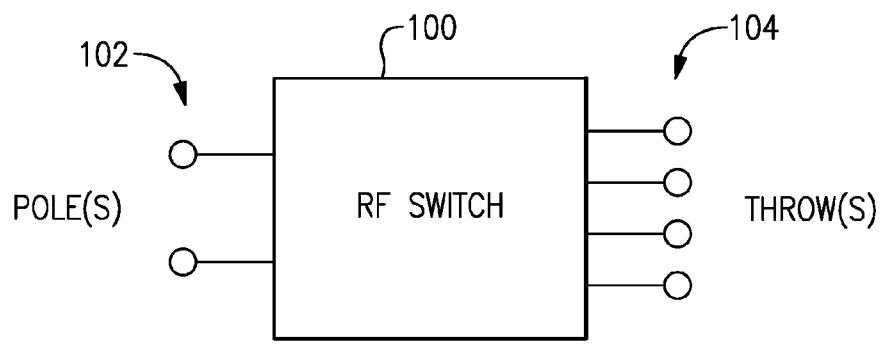
FIG. 1 schematically shows a radio-frequency (RF) switch configured to switch one or more signals between one or more poles and one or more throws.

FIG. 1 schematically shows a radio-frequency (RF) switch 100 configured to switch one or more signals between one or more poles 102 and one or more throws 104. In some embodiments, such a switch can be based on one or more field-effect transistors (FETs) such as silicon-on-insulator (SOI) FETs. When a particular pole is connected to a particular throw, such a path is commonly referred to as being closed or in an ON state. When a given path between a pole and a throw is not connected, such a path is commonly referred to as being open or in an OFF state.

Figure 2:
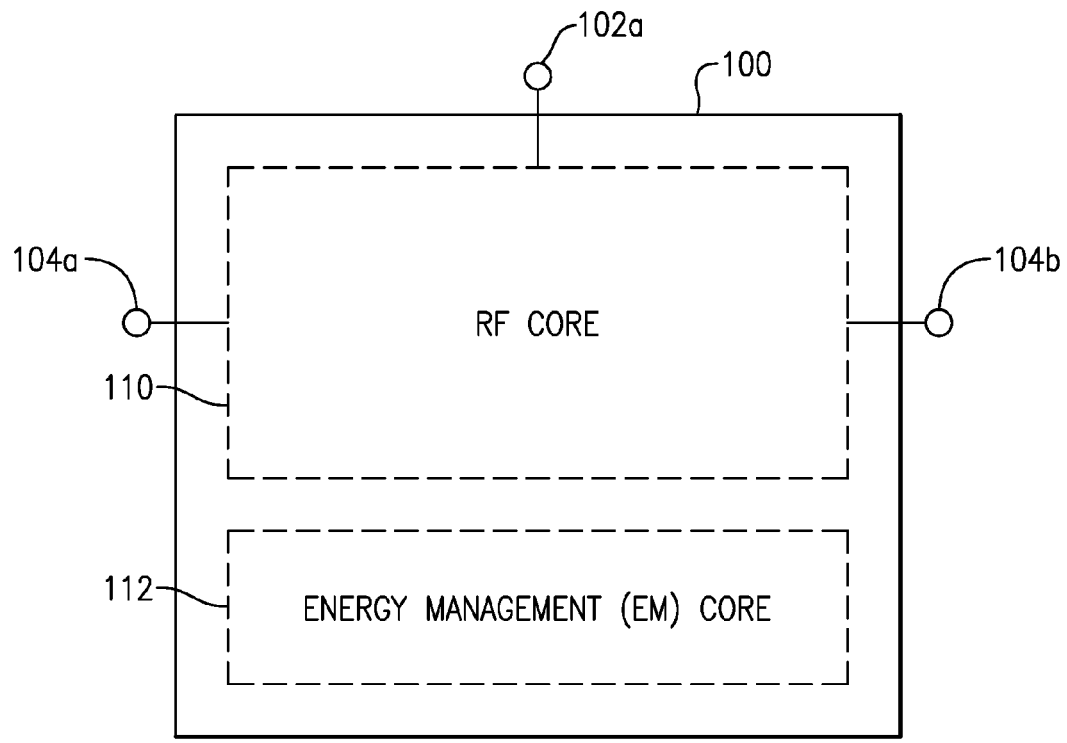
FIG. 2 shows that the RF switch 100 of FIG. 1 can include an RF core and an energy management (EM) core.

FIG. 2 shows that in some implementations, the RF switch 100 of FIG. 1 can include an RF core 110 and an energy management (EM) core 112. The RF core 110 can be configured to route RF signals between the first and second ports. In the example single-pole-double-throw (SPDT) configuration shown in FIG. 2, such first and second ports can include a pole 102a and a first throw 104a, or the pole 102a and a second throw 104b.

In some embodiments, EM core 112 can be configured to supply, for example, voltage control signals to the RF core. The EM core 112 can be further configured to provide the RF switch 100 with logic decoding and/or power supply conditioning capabilities.

In some embodiments, the RF core 110 can include one or more poles and one or more throws to enable passage of RF signals between one or more inputs and one or more outputs of the switch 100. For example, the RF core 110 can include a single-pole double-throw (SPDT or SP2T) configuration as shown in FIG. 2.

Figure 3:
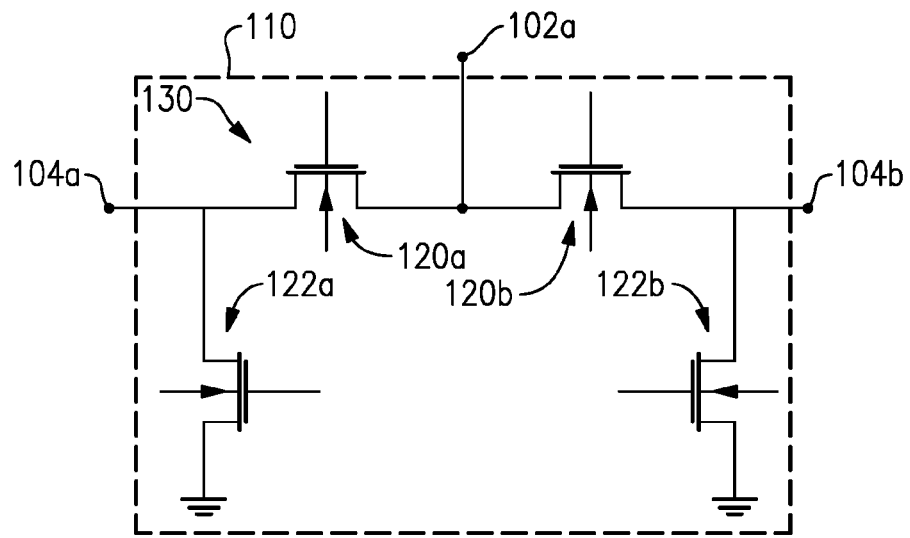
FIG. 3 shows an example of the RF core implemented in an single-pole-double-throw (SPDT) configuration.

In the example SPDT context, FIG. 3 shows a more detailed example configuration of an RF core 110. The RF core 110 is shown to include a single pole 102a coupled to first and second throw nodes 104a, 104b via first and second transistors (e.g., FETs) 120a, 120b. The first throw node 104a is shown to be coupled to an RF ground via an FET 122a to provide shunting capability for the node 104a. Similarly, the second throw node 104b is shown to be coupled to the RF ground via an FET 122b to provide shunting capability for the node 104b.

In an example operation, when the RF core 110 is in a state where an RF signal is being passed between the pole 102a and the first throw 104a, the FET 120a between the pole 102a and the first throw node 104a can be in an ON state, and the FET 120b between the pole 102a and the second throw node 104b can be in an OFF state. For the shunt FETs 122a, 122b, the shunt FET 122a can be in an OFF state so that the RF signal is not shunted to ground as it travels from the pole 102a to the first throw node 104a. The shunt FET 122b associated with the second throw node 104b can be in an ON state so that any RF signals or noise arriving at the RF core 110 through the second throw node 104b is shunted to the ground so as to reduce undesirable interference effects to the pole-to-first-throw operation.

Although the foregoing example is described in the context of a single-pole-double-throw configuration, it will be understood that the RF core can be configured with other numbers of poles and throws. For example, there may be more than one poles, and the number of throws can be less than or greater than the example number of two.

In the example of FIG. 3, the transistors between the pole 102a and the two throw nodes 104a, 104b are depicted as single transistors. In some implementations, such switching functionalities between the pole(s) and the throw(s) can be provided by switch arm segments, where each switch arm segment includes a plurality of transistors such as FETs.

Figure 4:
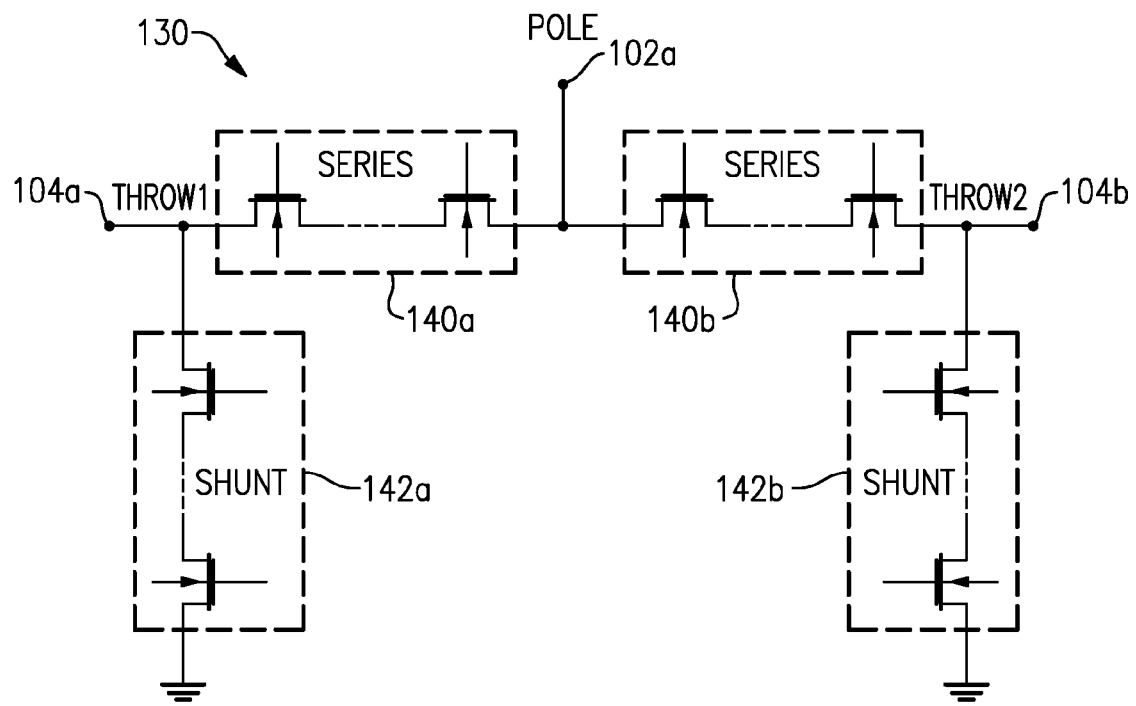
FIG. 4 shows an example of the RF core implemented in an SPDT configuration where each switch arm can include a plurality of field-effect transistors (FETs) connected in series.

An example RF core configuration 130 of an RF core having such switch arm segments is shown in FIG. 4. In the example, the pole 102a and the first throw node 104a are shown to be coupled via a first switch arm segment 140a. Similarly, the pole 102a and the second throw node 104b are shown to be coupled via a second switch arm segment 140b. The first throw node 104a is shown to be capable of being shunted to an RF ground via a first shunt arm segment 142a. Similarly, the second throw node 104b is shown to be capable of being shunted to the RF ground via a second shunt arm segment 142b.

In an example operation, when the RF core 130 is in a state where an RF signal is being passed between the pole 102a and the first throw node 104a, all of the FETs in the first switch arm segment 140a can be in an ON state, and all of the FETs in the second switch arm segment 104b can be in an OFF state. The first shunt arm 142a for the first throw node 104a can have all of its FETs in an OFF state so that the RF signal is not shunted to ground as it travels from the pole 102a to the first throw node 104a. All of the FETs in the second shunt arm 142b associated with the second throw node 104b can be in an ON state so that any RF signals or noise arriving at the RF core 130 through the second throw node 104b is shunted to the ground so as to reduce undesirable interference effects to the pole-to-first-throw operation.

Again, although described in the context of an SP2T configuration, it will be understood that RF cores having other numbers of poles and throws can also be implemented.

In some implementations, a switch arm segment (e.g., 140a, 140b, 142a, 142b) can include one or more semiconductor transistors such as FETs. In some embodiments, an FET may be capable of being in a first state or a second state and can include a gate, a drain, a source, and a body (sometimes also referred to as a substrate. In some embodiments, an FET can include a metal-oxide-semiconductor field effect transistor (MOSFET). In some embodiments, one or more FETs can be connected in series forming a first end and a second end such that an RF signal can be routed between the first end and the second end when the FETs are in a first state (e.g., ON state).

Figure 5:
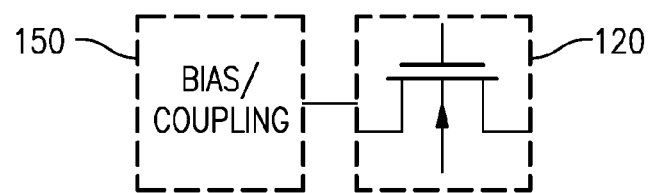
FIG. 5 schematically shows that controlling of one or more FETs in an RF switch can be facilitated by a circuit configured to bias and/or couple one or more portions of the FETs.

At least some of the present disclosure relates to how an FET or a group of FETs can be controlled to provide switching functionalities in desirable manners. FIG. 5 schematically shows that in some implementations, such controlling of an FET 120 can be facilitated by a circuit 150 configured to bias and/or couple one or more portions of the FET 120. In some embodiments, such a circuit 150 can include one or more circuits configured to bias and/or couple a gate of the FET 120, bias and/or couple a body of the FET 120, and/or couple a source/drain of the FET 120.

Figure 6:
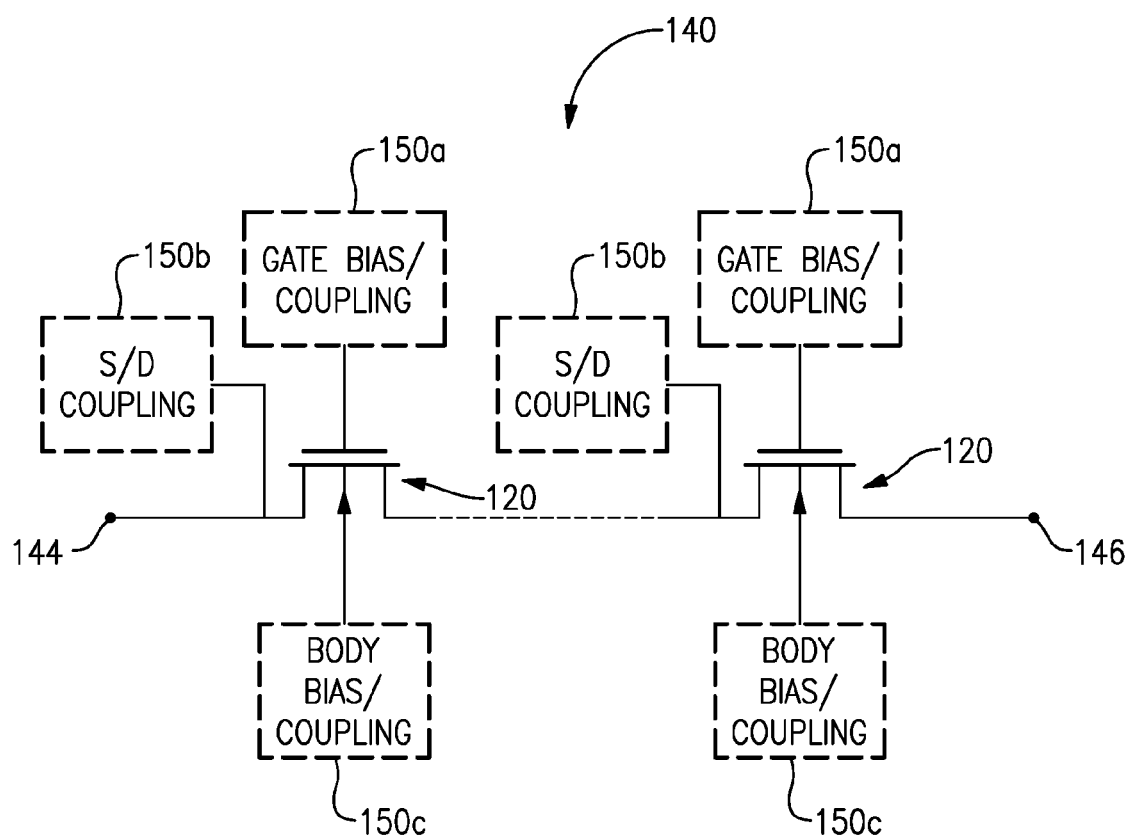
FIG. 6 shows examples of the bias/coupling circuit implemented on different parts of a plurality of FETs in a switch arm.

Schematic examples of how such biasing and/or coupling of different parts of one or more FETs are described in reference to FIG. 6. In FIG. 6, a switch arm segment 140 (that can be, for example, one of the example switch arm segments 140a, 140b, 142a, 142b of the example of FIG. 4) between nodes 144, 146 is shown to include a plurality of FETs 120. Operations of such FETs can be controlled and/or facilitated by a gate bias/coupling circuit 150a, and a body bias/coupling circuit 150c, and/or a source/drain coupling circuit 150b.

Gate Bias/Coupling Circuit

In the example shown in FIG. 6, the gate of each of the FETs 120 can be connected to the gate bias/coupling circuit 150a to receive a gate bias signal and/or couple the gate to another part of the FET 120 or the switch arm 140. In some implementations, designs or features of the gate bias/coupling circuit 150a can improve performance of the switch arm 140. Such improvements in performance can include, but are not limited to, device insertion loss, isolation performance, power handling capability and/or switching device linearity.

Body Bias/Coupling Circuit

As shown in FIG. 6, the body of each FET 120 can be connected to the body bias/coupling circuit 150c to receive a body bias signal and/or couple the body to another part of the FET 120 or the switch arm 140. In some implementations, designs or features of the body bias/coupling circuit 150c can improve performance of the switch arm 140. Such improvements in performance can include, but are not limited to, device insertion loss, isolation performance, power handling capability and/or switching device linearity.

Source/Drain Coupling Circuit

As shown in FIG. 6, the source/drain of each FET 120 can be connected to the coupling circuit 150b to couple the source/drain to another part of the FET 120 or the switch arm 140. In some implementations, designs or features of the coupling circuit 150b can improve performance of the switch arm 140. Such improvements in performance can include, but are not limited to, device insertion loss, isolation performance, power handling capability and/or switching device linearity.

Examples of Switching Performance Parameters

Insertion Loss

A switching device performance parameter can include a measure of insertion loss. A switching device insertion loss can be a measure of the attenuation of an RF signal that is routed through the RF switching device. For example, the magnitude of an RF signal at an output port of a switching device can be less than the magnitude of the RF signal at an input port of the switching device. In some embodiments, a switching device can include device components that introduce parasitic capacitance, inductance, resistance, or conductance into the device, contributing to increased switching device insertion loss. In some embodiments, a switching device insertion loss can be measured as a ratio of the power or voltage of an RF signal at an input port to the power or voltage of the RF signal at an output port of the switching device. Decreased switching device insertion loss can be desirable to enable improved RF signal transmission.

Isolation

A switching device performance parameter can also include a measure of isolation. Switching device isolation can be a measure of the RF isolation between an input port and an output port an RF switching device. In some embodiments, it can be a measure of the RF isolation of a switching device while the switching device is in a state where an input port and an output port are electrically isolated, for example while the switching device is in an OFF state. Increased switching device isolation can improve RF signal integrity. In certain embodiments, an increase in isolation can improve wireless communication device performance.

Intermodulation Distortion

A switching device performance parameter can further include a measure of intermodulation distortion (IMD) performance. Intermodulation distortion (IMD) can be a measure of non-linearity in an RF switching device.

IMD can result from two or more signals mixing together and yielding frequencies that are not harmonic frequencies. For example, suppose that two signals have fundamental frequencies $f_1$ and $f_2$ ($f_2 > f_1$) that are relatively close to each other in frequency space. Mixing of such signals can result in peaks in frequency spectrum at frequencies corresponding to different products of fundamental and harmonic frequencies of the two signals. For example, a second-order intermodulation distortion (also referred to as IMD2) is typically considered to include frequencies $f_1 + f_2$, $f_2 - f_1$, $2f_1$, and $2f_2$. A third-order IMD (also referred to as IMD3) is typically considered to include $2f_1 + f_2$, $2f_1 - f_2$, $f_1 + 2f_2$, $f_1 - 2f_2$. Higher order products can be formed in similar manners.

In general, as the IMD order number increases, power levels decrease. Accordingly, second and third orders can be undesirable effects that are of particular interest. Higher orders such as fourth and fifth orders can also be of interest in some situations.

In some RF applications, it can be desirable to reduce susceptibility to interference within an RF system. Non linearity in RF systems can result in introduction of spurious signals into the system. Spurious signals in the RF system can result in interference within the system and degrade the information transmitted by RF signals. An RF system having increased non-linearity can demonstrate increased susceptibility to interference. Non-linearity in system components, for example switching devices, can contribute to the introduction of spurious signals into the RF system, thereby contributing to degradation of overall RF system linearity and IMD performance.

In some embodiments, RF switching devices can be implemented as part of an RF system including a wireless communication system. IMD performance of the system can be improved by increasing linearity of system components, such as linearity of an RF switching device. In some embodiments, a wireless communication system can operate in a multi-band and/or multi-mode environment. Improvement in intermodulation distortion (IMD) performance can be desirable in wireless communication systems operating in a multi-band and/or multi-mode environment. In some embodiments, improvement of a switching device IMD performance can improve the IMD performance of a wireless communication system operating in a multi-mode and/or multi-band environment.

Improved switching device IMD performance can be desirable for wireless communication devices operating in various wireless communication standards, for example for wireless communication devices operating in the LTE communication standard. In some RF applications, it can be desirable to improve linearity of switching devices operating in wireless communication devices that enable simultaneous transmission of data and voice communication. For example, improved IMD performance in switching devices can be desirable for wireless communication devices operating in the LTE communication standard and performing simultaneous transmission of voice and data communication (e.g., SVLTE).

High Power Handling Capability

In some RF applications, it can be desirable for RF switching devices to operate under high power while reducing degradation of other device performance parameters. In some embodiments, it can be desirable for RF switching devices to operate under high power with improved intermodulation distortion, insertion loss, and/or isolation performance.

In some embodiments, an increased number of transistors can be implemented in a switch arm segment of a switching device to enable improved power handling capability of the switching device. For example, a switch arm segment can include an increased number of FETs connected in series, an increased FET stack height, to enable improved device performance under high power. However, in some embodiments, increased FET stack height can degrade the switching device insertion loss performance.

Examples of FET Structures and Fabrication Process Technologies

A switching device can be implemented on-die, off-die, or some combination thereon. A switching device can also be fabricated using various technologies. In some embodiments, RF switching devices can be fabricated with silicon or silicon-on-insulator (SOI) technology.

As described herein, an RF switching device can be implemented using silicon-on-insulator (SOI) technology. In some embodiments, SOI technology can include a semiconductor substrate having an embedded layer of electrically insulating material, such as a buried oxide layer beneath a silicon device layer. For example, an SOI substrate can include an oxide layer embedded below a silicon layer. Other insulating materials known in the art can also be used.

Implementation of RF applications, such as an RF switching device, using SOI technology can improve switching device performance. In some embodiments, SOI technology can enable reduced power consumption. Reduced power consumption can be desirable in RF applications, including those associated with wireless communication devices. SOI technology can enable reduced power consumption of device circuitry due to decreased parasitic capacitance of transistors and interconnect metallization to a silicon substrate. Presence of a buried oxide layer can also reduce junction capacitance or use of high resistivity substrate, enabling reduced substrate related RF losses. Electrically isolated SOI transistors can facilitate stacking, contributing to decreased chip size.

Figure 7A:
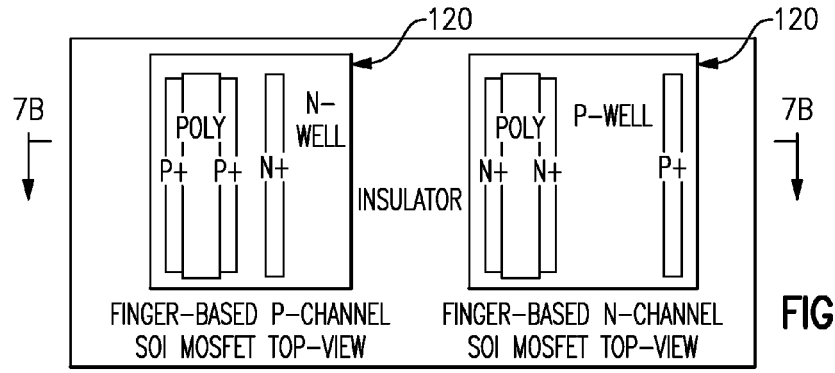
FIGS. 7A and 7B show plan and side sectional views of an example finger-based FET device implemented in a silicon-on-insulator (SOI) configuration.
Figure 7B:
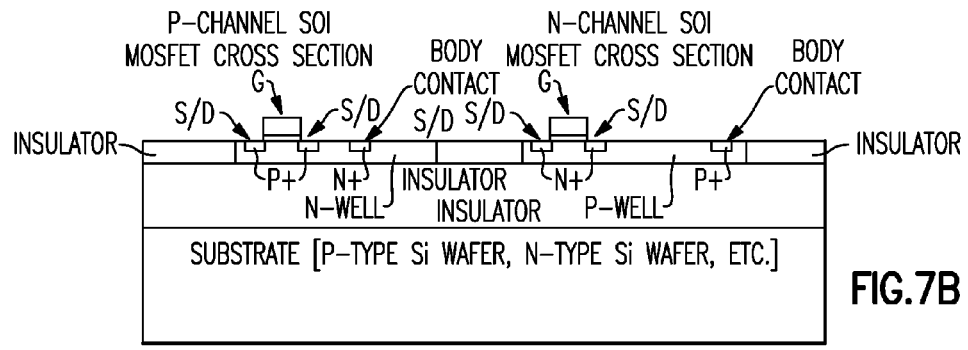

In some SOI FET configurations, each transistor can be configured as a finger-based device where the source and drain are rectangular shaped (in a plan view) and a gate structure extends between the source and drain like a rectangular shaped finger. FIGS. 7A and 7B show plan and side sectional views of an example finger-based FET device implemented on SOI. As shown, FET devices described herein can include a p-type FET or an n-type FET. Thus, although some FET devices are described herein as p-type devices, it will be understood that various concepts associated with such p-type devices can also apply to n-type devices.

As shown in FIGS. 7A and 7B, a pMOSFET can include an insulator layer formed on a semiconductor substrate. The insulator layer can be formed from materials such as silicon dioxide or sapphire. An n-well is shown to be formed in the insulator such that the exposed surface generally defines a rectangular region. Source (S) and drain (D) are shown to be p-doped regions whose exposed surfaces generally define rectangles. As shown, S/D regions can be configured so that source and drain functionalities are reversed.

FIGS. 7A and 7B further show that a gate (G) can be formed on the n-well so as to be positioned between the source and the drain. The example gate is depicted as having a rectangular shape that extends along with the source and the drain. Also shown is an n-type body contact. Formations of the rectangular shaped well, source and drain regions, and the body contact can be achieved by a number of known techniques. In some embodiments, the source and drain regions can be formed adjacent to the ends of their respective upper insulator layers, and the junctions between the body and the source/drain regions on the opposing sides of the body can extend substantially all the way down to the top of the buried insulator layer. Such a configuration can provide, for example, reduced source/drain junction capacitance. To form a body contact for such a configuration, an additional gate region can be provided on the side so as to allow, for example, an isolated P+ region to contact the Pwell.

Figure 8A:
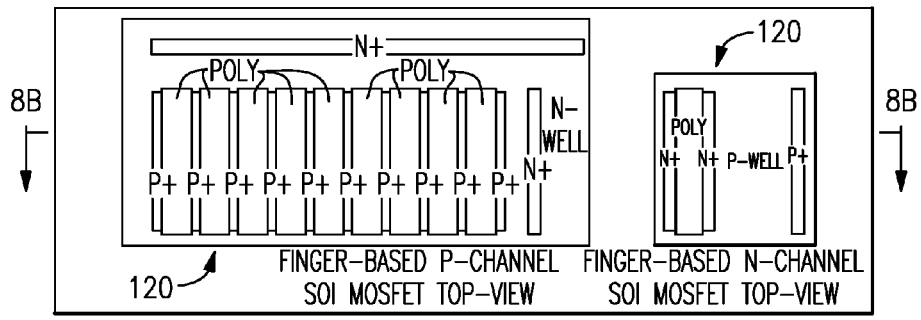
FIGS. 8A and 8B show plan and side sectional views of an example of a multiple-finger FET device implemented in an SOI configuration.
Figure 8B:
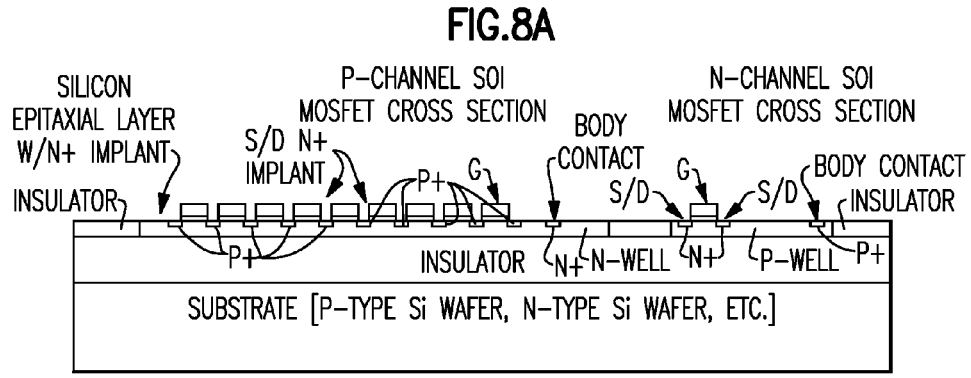

FIGS. 8A and 8B show plan and side sectional views of an example of a multiple-finger FET device implemented on SOI. Formations of rectangular shaped n-well, rectangular shaped p-doped regions, rectangular shaped gates, and n-type body contact can be achieved in manners similar to those described in reference to FIGS. 7A and 7B.

The example multiple-finger FET device of FIGS. 8A and 8B can be made to operate such that a drain of one FET acts as a source of its neighboring FET. Thus, the multiple-finger FET device as a whole can provide a voltage-dividing functionality. For example, an RF signal can be provided at one of the outermost p-doped regions (e.g., the leftmost p-doped region); and as the signal passes through the series of FETs, the signal's voltage can be divided among the FETs. In such an example, the rightmost p-doped region can act as an overall drain of the multi-finger FET device.

In some implementations, a plurality of the foregoing multi-finger FET devices can be connected in series as a switch to, for example, further facilitate the voltage-dividing functionality. A number of such multi-finger FET devices can be selected based on, for example, power handling requirement of the switch.

Examples of Bias and/or Coupling Configurations for Improved Performance

Described herein are various examples of how FET-based switch circuits can be biased and/or coupled to yield one or more performance improvements. In some embodiments, such biasing/coupling configurations can be implemented in SOI FET-based switch circuits. It will be understood that some of the example biasing/coupling configurations can be combined to yield a combination of desirable features that may not be available to the individual configurations. It will also be understood that, although described in the context of RF switching applications, one or more features described herein can also be applied to other circuits and devices that utilize FETs such as SOI FETs.

Example Configuration

In some radio-frequency (RF) applications, it is desirable to utilize switches having high linearity, as well as management of intermodulation distortion (IMD) such as IMD3 and IMD2. Such switch-related performance features can contribute significantly to system-level performance of cellular devices. In the context of silicon-on-oxide (SOI) switches, factors such as substrate-coupling (sometimes also referred to as substrate parasitics) and SOI-process can limit the performance achievable.

Such a limitation in performance of SOI switches can be addressed by extensive substrate crosstalk reduction techniques such as capacitive guard rings, and/or trap rich or deep trench isolation techniques. Such techniques typically have associated with them undesirable features such as being expensive, requiring relatively large areas, and requiring additional process steps. Also, such technique can yield a desirable effect that is limited to an isolation feature.

Figure 9:
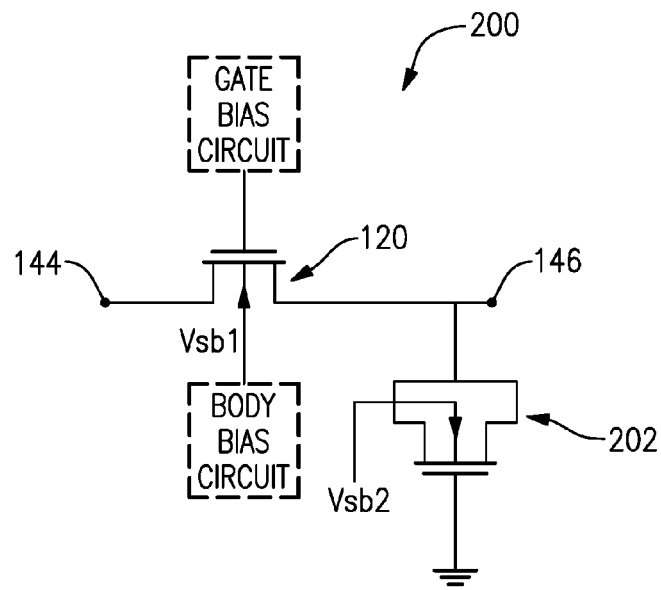
FIG. 9 shows a first example of an RF switch circuit having a non-linear capacitor connected to a source terminal of an FET and configured to, for example, cancel or reduce non-linearity effects generated by the FET.

In some implementations, performance of SOI switches can be improved by overcoming or reducing the foregoing effects associated with substrate parasitics and/or process variables. By way of an example, FIG. 9 shows a switch circuit 200 having an SOI FET 120 configured to provide switching functionality between first and second nodes 144, 146. A gate terminal of the FET 120 is shown to be biased by a bias voltage Vg provided by a gate bias circuit, and a body terminal of the FET 120 is shown to be biased by a bias voltage Vsb1 provided by a body bias circuit. In some embodiments, the body terminal can be connected to a source terminal, so that both terminals are provided with the bias voltage Vsb1.

In some embodiments, the source terminal of the FET 120 can be connected to a non-linear capacitor 202. In embodiments where the FET 120 is a MOSFET device, the capacitor 202 can be a MOSFET capacitor configured to provide one or more desired capacitance values. The MOS capacitor 202 can be configured to generate one or more harmonics to cancel or reduce non-linearity effects generated by the MOSFET 120. The MOS cap 202 is shown to be biased by Vsb2. In some embodiments, either or both of Vsb1 and Vsb2 can be adjusted to yield a desired level of non-linearity cancelation. Although described in the context of the source side of the FET 120, it will be understood that the MOS cap 202 can also be implemented on the drain side of the FET.

Figure 10:
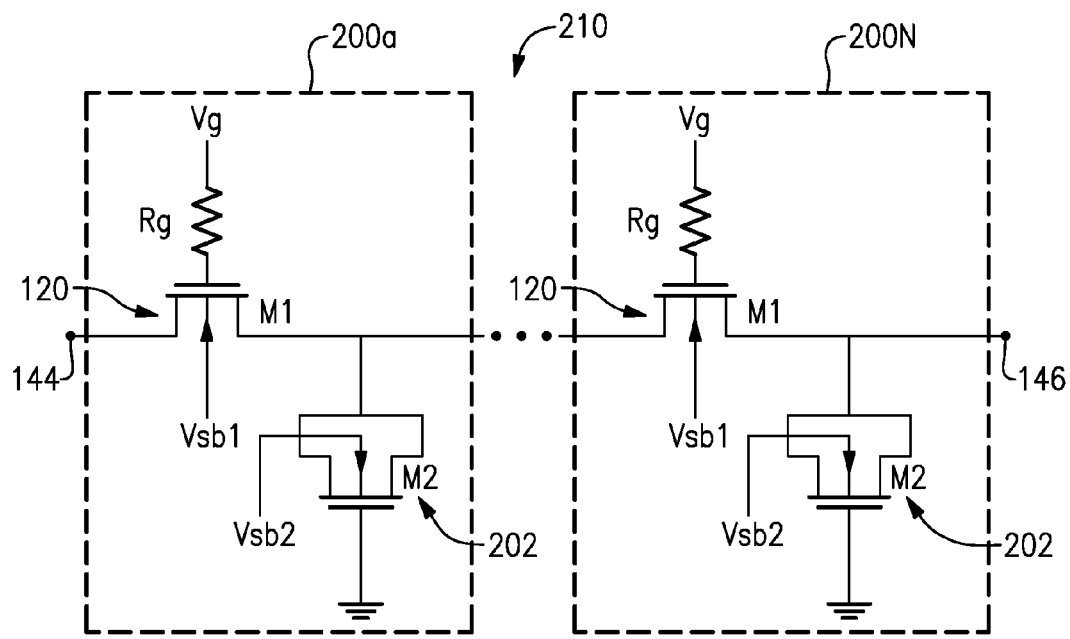
FIG. 10 shows that one or more features of FIG. 9 can be implemented in a switch arm having a plurality of FETs.

FIG. 10 shows a switch arm 210 having a plurality of the switch circuits 200 described in reference to FIG. 9. In the example, N such switch circuits are shown to be connected in series in a stack to provide switching functionality between terminals 144, 146. In some embodiments, the number (N) of FETs in such a stack can be selected based on power being transferred between the terminals 144, 146. For example, N can be larger for situations involving higher power.

In some embodiments, gate bias voltages (Vg) for the plurality of FETs 120 can be substantially the same, and be provided by a common gate bias circuit. Such a common gate bias voltage Vg is shown to be provided to the gates via a gate resistor Rg. Similarly, body bias voltages (Vsb1) for the plurality of FETs 120 can be substantially the same, and be provided by a common body bias circuit. Similarly, body bias voltages (Vsb2) for the plurality of MOS capacitors 202 can be substantially the same, and be provided by a common body bias circuit (not shown). In some implementations, some or all of the bodies of the FETs 120 and/or the MOS capacitors 202 can be biased separately. Such a configuration can be beneficial in some situations, depending on the frequency of operation.

In some implementations, the foregoing example configurations described in reference to FIGS. 9 and 10 can allow significant or substantially complete cancelation of non-linearity effects associated with one or more SOI FET based RF switches. In some embodiments, such configurations can be implemented so that minimal or relatively little additional area is required.

Examples of Implementations in Products

Various examples of FET-based switch circuits and bias/coupling configurations described herein can be implemented in a number of different ways and at different product levels. Some of such product implementations are described by way of examples.

Semiconductor Die Implementation

Figure 11A:
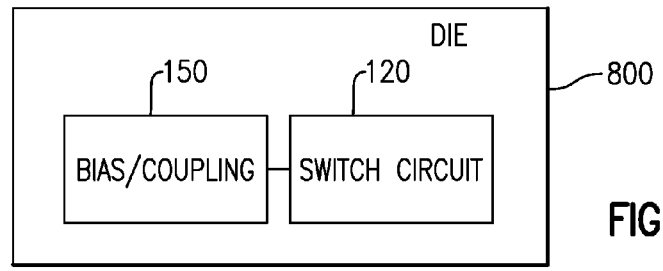
FIGS. 11A-11D show examples of how various components for biasing, coupling, and/or facilitating the example configurations of FIGS. 9-10 can be implemented.
Figure 11B:
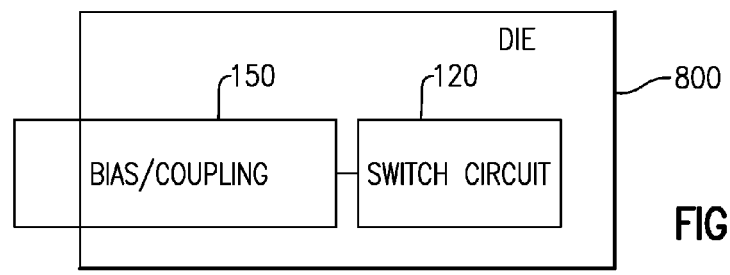

FIGS. 11A-11D schematically show non-limiting examples of such implementations on one or more semiconductor die. FIG. 11A shows that in some embodiments, a switch circuit 120 and a bias/coupling circuit 150 having one or more features as described herein can be implemented on a die 800. FIG. 11B shows that in some embodiments, at least some of the bias/coupling circuit 150 can be implemented outside of the die 800 of FIG. 11A.

Figure 11C:
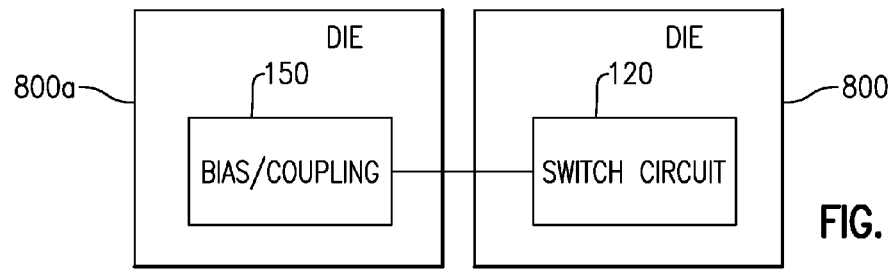
Figure 11D:
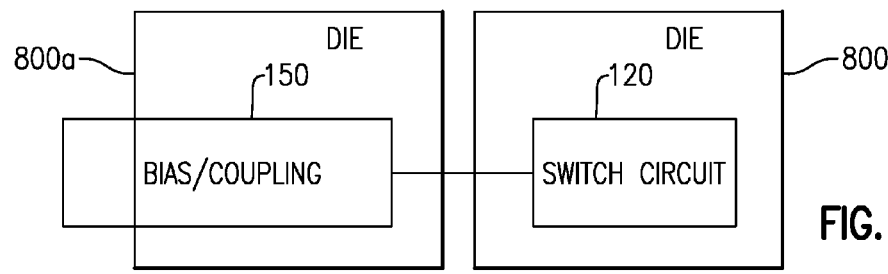

FIG. 11C shows that in some embodiments, a switch circuit 120 having one or more features as described herein can be implemented on a first die 800*a*, and a bias/coupling circuit 150 having one or more features as described herein can be implemented on a second die 800*b*. FIG. 11D shows that in some embodiments, at least some of the bias/coupling circuit 150 can be implemented outside of the first die 800*a* of FIG. 11C.

Packaged Module Implementation

Figure 12A:
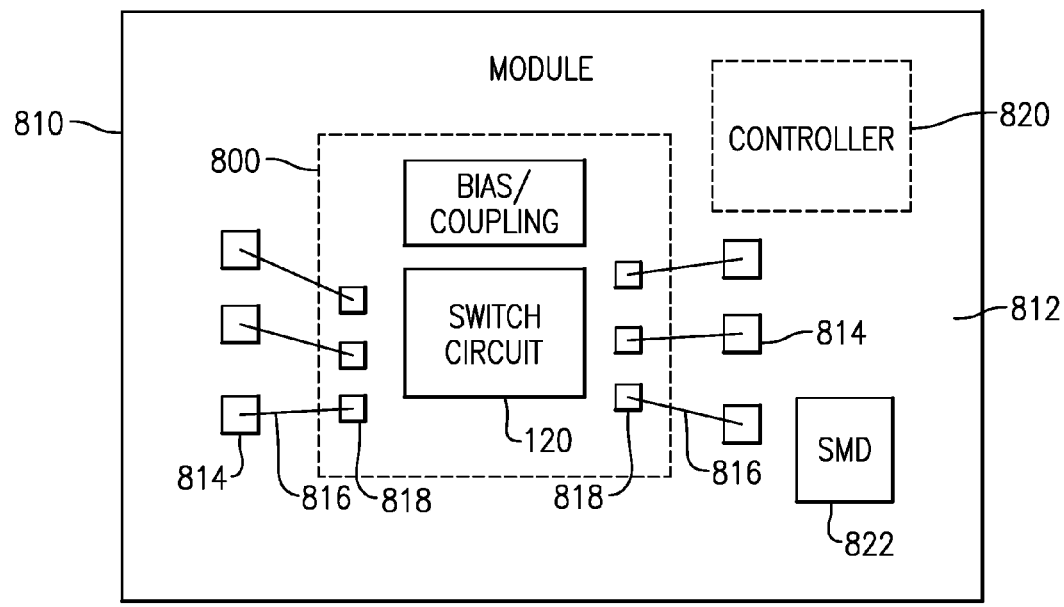
FIGS. 12A and 12B show an example of a packaged module that can include one or more features described herein.

In some embodiments, one or more die having one or more features described herein can be implemented in a packaged module. An example of such a module is shown in FIGS. 12A (plan view) and 12B (side view). Although described in the context of both of the switch circuit and the bias/coupling circuit being on the same die (e.g., example configuration of FIG. 11A), it will be understood that packaged modules can be based on other configurations.

A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 120 and a bias/coupling circuit 150 is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 12B:
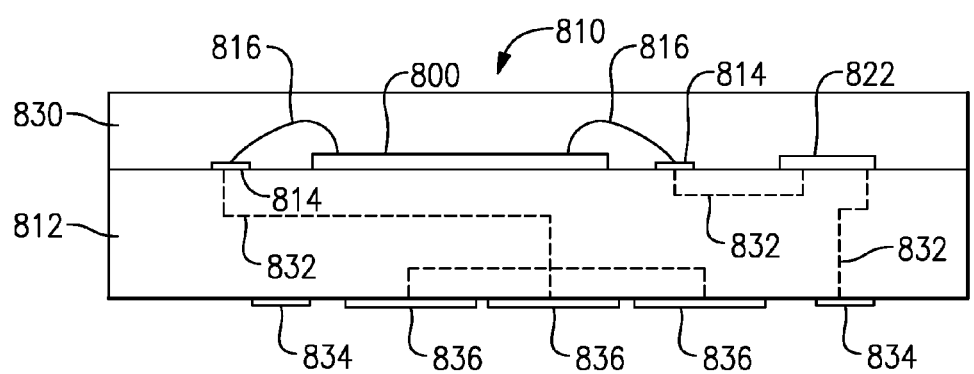
Figure 13:
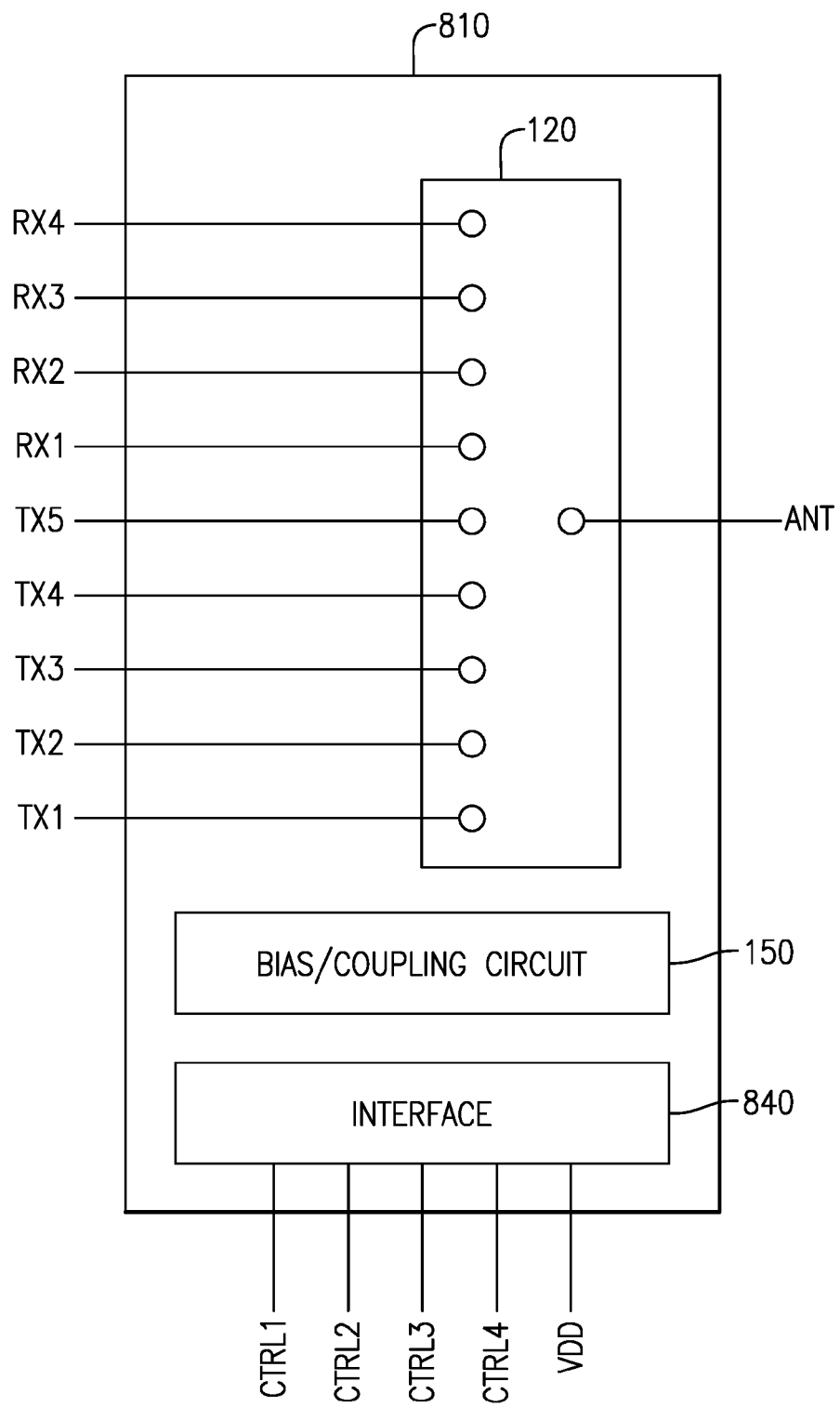
FIG. 13 shows that in some embodiments, one or more features of the present disclosure can be implemented in a switch device such as a single-pole-multi-throw (SPMT) switch configured to facilitate multi-band multi-mode wireless operation.

FIG. 13 shows a schematic diagram of an example switching configuration that can be implemented in the module 810 described in reference to FIGS. 12A and 12B. In the example, the switch circuit 120 is depicted as being an SP9T switch, with the pole being connectable to an antenna and the throws being connectable to various Rx and Tx paths. Such a configuration can facilitate, for example, multi-mode multi-band operations in wireless devices.

The module 810 can further include an interface for receiving power (e.g., supply voltage VDD) and control signals to facilitate operation of the switch circuit 120 and/or the bias/coupling circuit 150. In some implementations, supply voltage and control signals can be applied to the switch circuit 120 via the bias/coupling circuit 150.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 14:
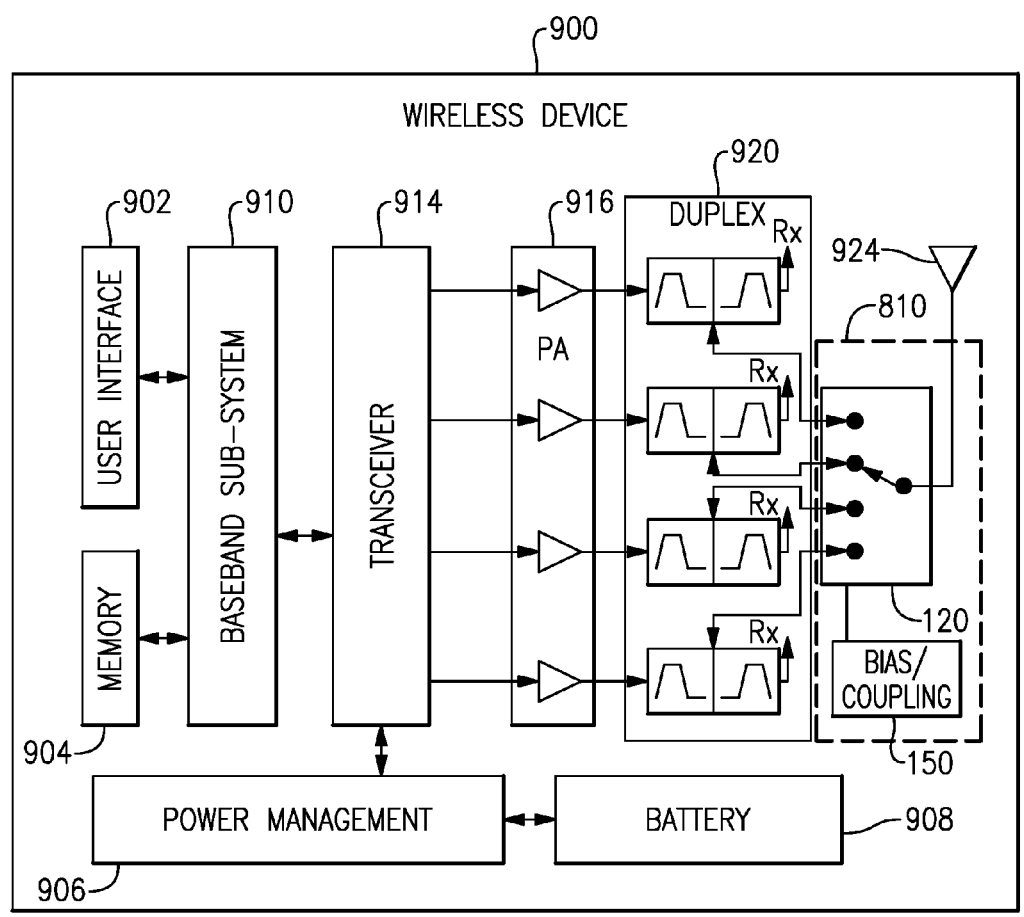
FIG. 14 shows an example of a wireless device that can include one or more features described herein.

FIG. 14 schematically depicts an example wireless device 900 having one or more advantageous features described herein. In the context of various switches and various biasing/coupling configurations as described herein, a switch 120 and a bias/coupling circuit 150 can be part of a module 810. In some embodiments, such a switch module can facilitate, for example, multi-band multip-mode operation of the wireless device 900.

In the example wireless device 900, a power amplifier (PA) module 916 having a plurality of PAs can provide an amplified RF signal to the switch 120 (via a duplexer 920), and the switch 120 can route the amplified RF signal to an antenna. The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 810.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 920 can allow transmit and receive operations to be performed simultaneously using a common antenna (e.g., 924). In FIG. 14, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency switch comprising:
    at least one field-effect transistor disposed between a first node and a second node, each of the at least one field-effect transistor having a respective source, drain, gate, and body; and
    a compensation circuit connected to the respective drain of the at least one field-effect transistor, the compensation circuit configured to compensate a non-linearity effect generated by the at least one field-effect transistor.

2. The switch of claim 1 wherein the at least one field-effect transistor is a silicon-on-insulator field-effect transistor.

3. The switch of claim 1 wherein the compensation circuit includes a non-linear capacitor connected at a first end to both the source of a first field-effect transistor of the at least one field-effect transistor and the drain of a second field-effect transistor of the at least one field-effect transistor, the non-linear capacitor further being connected at a second end to a ground reference.

4. The switch of claim 3 wherein the non-linear capacitor includes a metal-oxide-semiconductor capacitor.

5. The switch of claim 4 wherein the metal-oxide-semiconductor capacitor is configured to generate one or more harmonics to substantially cancel the non-linearity effect generated by the at least one field-effect transistor.

6. The switch of claim 5 wherein the metal-oxide-semiconductor capacitor includes a field-effect transistor structure.

7. The switch of claim 6 wherein the one or more harmonics generated by the metal-oxide-semiconductor capacitor is controlled at least in part by a body bias signal provided to the field-effect transistor structure of the metal-oxide-semiconductor capacitor.

8. The switch of claim 1 further comprising a gate bias circuit connected to and configured to provide a bias signal to the gate of the at least one field-effect-transistor.

9. The switch of claim 1 further comprising a body bias circuit connected to and configured to provide a bias signal to the body of the at least one field-effect-transistor.

10. The switch of claim 1 wherein the at least one field-effect transistor includes N field-effect transistors connected in series, the quantity N selected to allow the switch to handle a power level of an RF signal received at the first node.

11. A method for operating a radio-frequency (RF) switch, the method comprising:
    controlling at least one field-effect transistor disposed between first and second nodes so that the at least one field-effect transistor is in an ON state or an OFF state; and
    compensating a non-linear effect of the field-effect transistor by applying a non-linear signal to a source or a drain of the at least one field-effect transistor.

12. The method of claim 11 wherein said compensating the non-linear effect is performed using a non-linear capacitor.

13. The method of claim 12 wherein said compensating the non-linear effect involves generating one or more harmonics using the non-linear capacitor to substantially cancel the non-linearity effect generated by the at least one field-effect transistor.

14. The method of claim 13 further comprising controlling the one or more harmonics at least in part by providing a body bias signal to the non-linear capacitor.

15. The method of claim 12 wherein the non-linear capacitor is connected at a first end to a source of a first field-effect transistor of the at least one field-effect transistor and a drain of a second field-effect transistor of the at least one field-effect transistor, the non-linear capacitor further being connected at a second end to a ground reference.

16. The method of claim 12 further comprising providing a bias signal to a gate of the field-effect transistor.

17. The method of claim 12 further comprising providing a bias signal to a body of the field-effect transistor.

18. A wireless device comprising:
    a transceiver configured to process radio-frequency signals;
    an antenna in communication with the transceiver configured to facilitate transmission of an amplified radio-frequency signal;
    a power amplifier connected to the transceiver and configured to generate the amplified radio-frequency signal; and a switch connected to the antenna and the power amplifier and configured to selectively route the amplified radio-frequency signal to the antenna, the switch including at least one field-effect transistor, the switch further including a compensation circuit connected to a respective source or a respective drain of each of the at least one field-effect transistor, the compensation circuit configured to compensate a non-linearity effect generated by the at least one field-effect transistor.

19. The wireless device of claim 18 wherein the compensation circuit includes a non-linear capacitor connected at a first end to both the source of a first field-effect transistor of the at least one field-effect transistor and the drain of a second field-effect transistor of the at least one field-effect transistor, the non-linear capacitor being further connected at a second end to a ground reference.

20. The wireless device of claim 19 wherein the non-linear capacitor includes a metal-oxide-semiconductor capacitor including a field-effect transistor structure.

* * * * *